United States Patent
Isoyan et al.

(10) Patent No.: US 10,365,557 B2
(45) Date of Patent: Jul. 30, 2019

(54) COMPACT OPC MODEL GENERATION USING VIRTUAL DATA

(71) Applicant: Synopsys Inc., Mountain View, CA (US)

(72) Inventors: Artak Isoyan, Beaverton, OR (US); Lawrence S. Melvin, III, Hillsboro, OR (US)

(73) Assignee: SYNOPSYS, INC., Mountain View, CA (US)

( * ) Notice: Subject to any disclaimer, the term of this patent is extended or adjusted under 35 U.S.C. 154(b) by 1106 days.

(21) Appl. No.: 14/184,548

(22) Filed: Feb. 19, 2014

(65) Prior Publication Data

US 2014/0244226 A1    Aug. 28, 2014

Related U.S. Application Data

(60) Provisional application No. 61/768,529, filed on Feb. 24, 2013.

(51) Int. Cl.
| | |
|---|---|
| *G06G 7/48* | (2006.01) |
| *G03F 1/36* | (2012.01) |
| *G03F 7/20* | (2006.01) |
| *G06F 17/50* | (2006.01) |

(52) U.S. Cl.
CPC ............ *G03F 1/36* (2013.01); *G03F 7/70441* (2013.01); *G06F 17/50* (2013.01)

(58) Field of Classification Search
None
See application file for complete search history.

(56) References Cited

U.S. PATENT DOCUMENTS

| | | | | |
|---|---|---|---|---|
| 6,602,728 | B1 * | 8/2003 | Liebmann | G03F 1/36 438/14 |
| 7,743,357 | B2 * | 6/2010 | Huang | G03F 7/705 716/50 |
| 2006/0190914 | A1 * | 8/2006 | Melvin, III | G03F 1/36 716/52 |
| 2007/0124718 | A1 * | 5/2007 | Kobayashi | G03F 1/36 430/5 |
| 2008/0044748 | A1 * | 2/2008 | Han | G03F 7/70441 430/22 |

(Continued)

OTHER PUBLICATIONS

Isoyan, Artak et al., "Process Window Modeling Using Focus Balancing Technique", Nov./Dec. 2011, J. Vac. Sci. Technol. B 29(6), Americal Vacuum Society.*

(Continued)

*Primary Examiner* — Cedric Johnson
(74) *Attorney, Agent, or Firm* — Alston & Bird LLP

(57) ABSTRACT

A method, system or computer usable program product for building a fast lithography OPC model that predicts semiconductor manufacturing process outputs on silicon wafers including providing a first principles model of the semiconductor manufacturing process, providing a set of empirical data for storage in memory, utilizing a processor to develop a rigorous model for a process condition from the first principles model and the set of empirical data, and utilizing the processor running the rigorous model to generate emulated data for the process condition to develop a virtual model for predicting the semiconductor manufacturing process outputs.

19 Claims, 9 Drawing Sheets

(56) References Cited

U.S. PATENT DOCUMENTS

| | | | |
|---|---|---|---|
| 2008/0301621 A1* | 12/2008 | Fukuhara | G03F 1/144 716/51 |
| 2009/0119045 A1* | 5/2009 | Wu | G03F 1/84 702/82 |
| 2009/0157360 A1* | 6/2009 | Ye | G03F 7/705 703/2 |
| 2011/0224963 A1* | 9/2011 | Isoyan | G03F 7/705 703/14 |

OTHER PUBLICATIONS

Isoyan, Artak et al., "Stepwise Fitting Methodology for Optical Proximity Correction Modeling", 2010, Optical Microlithography XXIII, vol. 7640, SPIE.*

Shim, Kyung-Jin et al., "Application of Full Chip OPC to Quarter Micron Logic Device", 1999, IEEE.*

Isoyan, Artak et al., "Full-Chip High Resolution Electron-Beam Lithography Proximity Effect Correction Modeling", Apr. 2, 2010, SPIE Advanced Lithography, SPIE. (Year: 2010).*

H. Fukua, K. Hattori and T. Hagiwara, "Impact of acid/quencher behavior on lithography performance", Proc. SPIE 4346, 319 (2001).

T. A. Brunner and R. A. Ferguson, "Approximate models for resist processing effects", Proc. SPIE 2726, 198 (1996).

M. Smith, J. Byers, C. Mack, "Comparison between the process windows calculated with full and simplified resist models", Proc. SPIE 4691, pp. 1199-1210 (2002).

B. W. Smith, H. Kang, A. Bourov, F. Cropanese, Y. Fan, "Water immersion optical lithography for 45-nm node", Proc. SPIE 5040, 679 (2003).

A. Isoyan, E. Croffie, L. Melvin, "Process window modeling using focus balancing technique", J. Vac. Sci. Technol. B, 29 (6), 06F903 (2011).

Q. Zhang, E. Croffie, Y. Fan, J. Li, K. Lucas, B. Falch and L. Melvin, "Process variation aware OPC modeling for leading edge technology nodes", Proc. SPIE 7275, 72751J (2009).

S. Mansfield, G. Han, L. Liebmann, "Through-process modeling for design-for-manufacturability applications", J. Micro/Nanolith. MEMS MOEMS 6, 031007 (2007).

C. Tabery, L. Page, "Use of design pattern layout for automatic metrology recipe generation", Proc. SPIE 5752, 1424 (2005).

P. Cantu, G. Capetti, C. Catarisano, F. D'Angelo, E. Evangelista, "Evaluation of Hitachi CAD to CD-SEM metrology package for OPC model tuning and product devices OPC verification", Proc. SPIE 5752, 1341 (2005).

B. J. Rice, H. Cao, M. Grumski, J. Roberts, "The limits of CD metrology", Microelectronic Engineering, vol. 83 (4-9), 1023-1029 (2006).

R. E. Schlief, "Effect of data selection and noise on goodness of OPC model fit", Proc. SPIE 5754, 1147 (2005).

Y. Granik, I. Kusnadi, "Challenges of OPC model calibration from SEM contours", Proc. SPIE 6922, 69221H (2008).

Y. Wang, J. Ho, B. Lin, C.-L. Lin, Y.-C. Sheng, "A simple and practical approach for building lithography simulation models using a limited set of CD data and SEM pictures", Proc. SPIE 6521, 65211S (2007).

A. Abdo, R. Viswanathan, "The feasibility of using image parameters for test pattern selection during OPC model calibration", Proc. SPIE 7640, 76401E (2010).

A. Isoyan, J. Li, L. S. Melvin, "Stepwise fitting methodology for optical proximity correction modeling", Proc. SPIE 7640, 764030 (2010).

M. Drapeau, B. Ward and B. Falch, "Automated OPC Model Collection, Cleaning and Calibration Flow", Proc. SPIE 7122, 71221O (2008).

C.-M. Ke, C.-C. Lee, Y.-H. Wang, H.-J. Lee, C.-H. Lin, "Evaluation of line and hole measurement by high-resolution low-magnification CD SEM", Proc. SPIE 5752, 1292 (2005).

B. Bunday, M. Bishop, J. S. Villarrubia, A. E. Vladar, "CD-SEM measurement line-edge roughness test patterns for 193-nm lithography", Proc. SPIE 5038, 674 (2003).

M. L. Schattenburg, H. Smith, "The critical role of metrology in nanotechnology", Proc. SPIE 4608, 116-124 (2001).

B. S. Ward, L. Zavyalova, P. Bisschop, J. Kerkhove, "Empirical study of OPC metrology requirements for 32-nm node logic", Proc. SPIE 7122, 712242 (2008).

\* cited by examiner

FIG. 5

|  | Model A | Model B | Model C |
|---|---|---|---|
| Measurement Count | 815 | 815 | 815 |
| Mean Residual Error | 0.0010 | 0.0319 | -0.0038 |
| RMS Residual Error | 0.8818 | 0.9937 | 0.7299 |
| Standard Deviation of Residual Error | 0.8823 | 0.9938 | 0.7303 |
| Min of Residual Error | -3.2423 | -4.6240 | -2.7512 |
| Max of Residual Error | 2.7609 | 2.7397 | 1.6714 |
| Residual Error Range | 6.0032 | 7.3637 | 4.4226 |

COMPACT OPC MODEL GENERATION USING VIRTUAL DATA

PRIORITY CLAIM

This application claims priority to U.S. Provisional Application No. 61/768,529 entitled "Compact OPC Model Generation Using Virtual Data" filed Feb. 24, 2013.

BACKGROUND

1. Technical Field

The present invention relates generally to Electronic Design Automation (EDA) and semiconductor manufacturing for the purpose of generating a compact Optical Proximity Correction (OPC) from a reduced set of measured process data, and in particular, to a computer implemented method for building a fast lithography model (compact OPC model) that predicts semiconductor manufacturing process outputs on silicon wafers by using a very limited amount of measured process data and completing the data set from a first principles simulation data source.

2. Description of Related Art

Semiconductor integrated circuit (IC) fabrication processes involve complex physical and chemical interactions. As the semiconductor fabrication processes become more complex, it is becoming more difficult to predict the outcome of such physical and chemical interactions in the processes. Process models are developed to predict the outcome of these processes. Process models may be a physical model, a black box model or a combination of both. A physical model is based on an understanding of the actual physical processes that occur during a fabrication process and attempts to simulate those processes. Conversely, a black box model is typically a statistical manipulation relying on statistical tools to fit a model to empirical data, but the model itself may have no relation to the actual underlying physical processes.

Physical models tend to exhibit better interpolation and extrapolation results compared to black box models. However, physical models can be computationally complex to implement and may be incapable of accommodating a large number of process parameters that affect the outcome of a fabrication process. On the other hand, black box models can often be extended to accommodate various processing parameters. However, the black box model is only as good as the underlying empirical data, and can suffer from inaccuracy when interpolating or extrapolating from available data points. Also, the empirical data gathered for these model forms is expensive in fabrication time, measurement time, and engineering time. A typical OPC model may use between 200 and 5000 data points that require several minutes each to collect and analyze.

Photolithography is the process of transferring patterns of geometric shapes on a mask to a thin layer of photosensitive material (resist) covering the surface of a semiconductor wafer. Photolithography is becoming a more sensitive and critical step in IC fabrication process as feature sizes shrink to ever smaller sizes. Various resolution enhancement techniques have been developed to form smaller features on the IC. One of such resolution enhancement techniques is optical proximity correction (OPC), which uses modified shapes in the mask geometry to account for proximity effects in the exposure process.

OPC models such as those generated by Synopsys' ProGen or Mentor Graphic's Calibre are comprised of a mathematical model form with parameters fit to empirical process data and are designed to calculate large volumes of data rapidly. As such, OPC models, also referred to as compact models, are able to simulate $10^{12}$ or more orders of magnitude of features on a semiconductor chip in a reasonable period of time. However, compact models are only capable of simulating one model value at a time for a point on a wafer under a single process condition. New model data are needed for simulating a model value for a point on the wafer under a different process condition. Thus compact models are very limited in their abilities to directly vary process conditions.

First principle models such Synopsys' Sentarus Lithography or KLA-Tencor's ProLith produce models based on mathematical models of manufacturing processes and provide detailed data about a feature in a manufacturing process. These first principle models, also referred to as rigorous models, do sometimes use empirical data to work with less stable process parameters such as parameters describing photoresist properties, but only in limited amounts normally much less than 100 points. First principle models have the advantage of providing detailed information about a pattern in three dimensions as well as in widely varying process conditions. However, first principle models have the disadvantage of requiring large amounts of time to simulate a small area, the time requirement is as much as $10^6$ times slower than a compact model.

Proximity effects can include both an optical effect and a resist effect. The optical effect accounts for optical diffraction caused by patterns on the mask. The optical effect is well understood and analyzed by using Hopkins model, for example. In an actual photolithography process, the proximity effect is greater than anticipated by the optical model. The greater proximity effect is due to non-optical factors that are referred to as the resist component. The resist component includes, among others, acid diffusion, and duration and condition of pre-exposure bake and/or post-exposure bake.

Process models associated with photolithography include constant threshold (CTR) models and variable threshold (VTR) models. The CTR model assumes that any area on a wafer subject to optical energy dose above a constant threshold level is developed. The CTR model is compact, shows good interpolation/extrapolation results, and has low computation requirement. However, the CTR model is incapable of taking various process parameters into account.

On the other hand, most of the VTR models use statistical tools to fit empirical data to an abstract model not related to the underlying physical processes. Although the VTR model is more advanced than the CTR model and uses statistical techniques to account for variations caused by various process parameters, the VTR model has less connection to the underlying physical processes associated with the photolithography process and, hence, shows limited accuracy when interpolating and extrapolating. Furthermore, the VTR model typically is more computationally intensive compared to the CTR model. The VTR model may also result in double contours instead of a single contour.

Other process models have been developed to account for the resist component of the proximity effect. Such models include, for example, the Mack kinetic development model, the Notch development model, the universal resist dissolution model, the extended Nijboer-Zernike model, acid diffusion models, acid-quencher diffusion models, and full three-dimensional resist development models. However, these models either lack accuracy or require extensive computational resources to simulate the photolithography process.

SUMMARY

The illustrative embodiments provide a method, system, and computer usable program product for building a fast lithography OPC model that predicts semiconductor manufacturing process outputs on silicon wafers including providing a first principles model of the semiconductor manufacturing process, providing a set of empirical data for storage in memory, utilizing a processor to develop a rigorous model for a process condition from the first principles model and the set of empirical data, and utilizing the processor running the rigorous model to generate emulated data for the process condition to develop a virtual model for predicting the semiconductor manufacturing process outputs.

BRIEF DESCRIPTION OF THE SEVERAL VIEWS OF THE DRAWINGS

The novel features believed characteristic of the invention are set forth in the appended claims. The invention itself, further objectives and advantages thereof, as well as a preferred mode of use, will best be understood by reference to the following detailed description of illustrative embodiments when read in conjunction with the accompanying drawings, wherein:

FIG. 5 is a flow diagram of a process for verifying the quality of the empirical data in accordance with a second embodiment;

DETAILED DESCRIPTION

Figure 1:
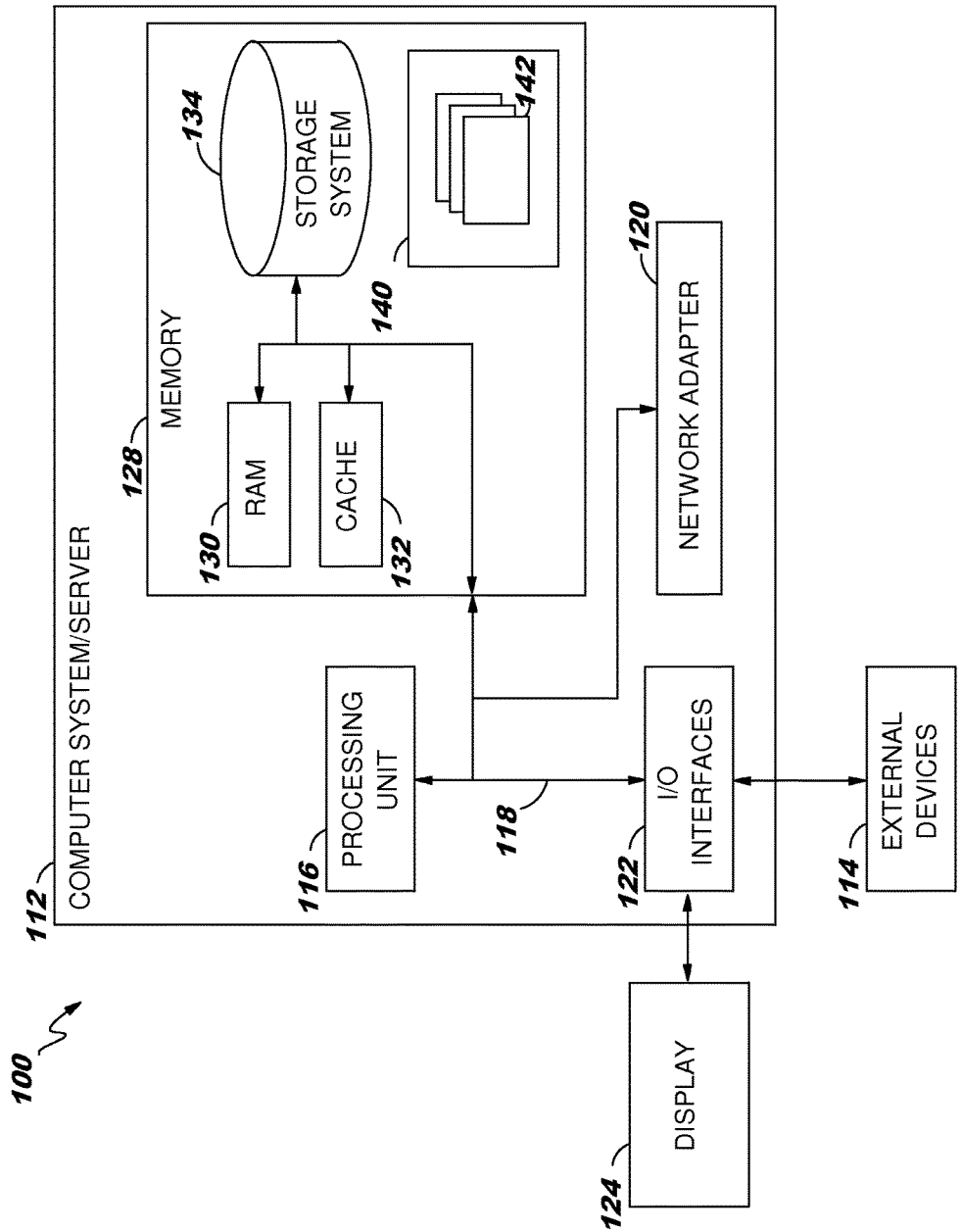
FIG. 1 is a block diagram of a data processing system in which various embodiments may be implemented.

Processes and devices may be implemented and utilized to build a first principles based rigorous model and then use that model to generate data for a virtual compact model. These processes and apparatuses may be implemented and utilized as will be explained with reference to the various embodiments below.

Various embodiments relate to modeling and simulating a semiconductor manufacturing process for the purpose of an OPC model based on a limited set of process data augmented by simulation from a first principles model. In these various embodiments, the data augmentation process can also be used to identify poor quality empirical data points. In additional embodiments, the augmented data can be used to generate process conditions outside of the measured process state, such as defocus or dose variation, for the purpose of building compact models that allow a feature to be explored through process. An additional embodiment can be used to generate compact models at various heights in photo resist.

In one approach empirical data are gathered from a top down CDSEM (critical dimension scanning electron microscope) and used to make a rigorous process model. The rigorous process model is then used to generate data that are used with or without the initial empirical data to fit a compact model for the purposes of OPC. This model is now referred as a virtual model.

In another embodiment, the empirical data can be used to generate a rigorous process model. The rigorous model can then be evaluated against the empirical data to identify if there are any empirical data points that are inconsistent with the full empirical data set, thus identifying bad data points.

In a further embodiment, empirical data can be collected in one process condition and used to generate a rigorous process model. The rigorous process model can then be used to generate virtual data for other process conditions and used to generate a virtual model for each process condition.

In an additional embodiment, empirical data can be collected and used to generate a rigorous process model. The rigorous process model can then be invoked to generate virtual data on resist shape through height, which cannot be readily directly measured with a CDSEM. These data can then be used to generate a virtual model at any resist height.

Several embodiments may be combined together to form one virtual model. Other aspects of the various embodiments include methods, computer systems and computer readable storage media related to the foregoing. Yet other aspects include pre- or post-processing steps for the foregoing, or applications that make use of the foregoing.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

FIG. 1 is a block diagram of a data processing system in which various embodiments may be implemented. Data processing system 100 is one example of a suitable data processing system and is not intended to suggest any limitation as to the scope of use or functionality of embodiments described herein. Regardless, data processing system 100 is capable of being implemented and/or performing any of the functionality set forth herein.

In data processing system 100 there is a computer system/server 112, which is operational with numerous other general purpose or special purpose computing system environments, peripherals, or configurations. Examples of well-known computing systems, environments, and/or configurations that may be suitable for use with computer system/server 112 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 112 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 112 may be practiced in distributed computing environments where tasks are performed by remote processing devices that are linked through a communications network. In a distributed computing environment, program modules may be located in both local and remote computer system storage media including memory storage devices.

As shown in FIG. 1, computer system/server 112 in data processing system 100 is shown in the form of a general-purpose computing device. The components of computer system/server 112 may include, but are not limited to, one or more processors or processing units 116, a system memory 128, and a bus 118 that couples various system components including system memory 128 to processor 116.

Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 112 typically includes a variety of computer system readable media. Such media may be any available media that is accessible by computer system/server 112, and it includes both volatile and non-volatile media, removable and non-removable media.

System memory 128 can include computer system readable media in the form of volatile memory, such as random access memory (RAM) 130 and/or cache memory 132. Computer system/server 112 may further include other removable/non-removable, volatile/non-volatile computer system storage media. By way of example, storage system 134 can be provided for reading from and writing to a non-removable, non-volatile magnetic media (not shown and typically called a "hard drive"). Although not shown, a USB interface for reading from and writing to a removable, non-volatile magnetic chip (e.g., a "flash drive"), and an optical disk drive for reading from or writing to a removable, non-volatile optical disk such as a CD-ROM, DVD-ROM or other optical media can be provided. In such instances, each can be connected to bus 118 by one or more data media interfaces. Memory 128 may include at least one program product having a set (e.g., at least one) of program modules that are configured to carry out the functions of various embodiments. Memory 128 may also include data that will be processed by a program product.

Program/utility 140, having a set (at least one) of program modules 142, may be stored in memory 128 by way of example, and not limitation, as well as an operating system, one or more application programs, other program modules, and program data. Each of the operating system, one or more application programs, other program modules, and program data or some combination thereof, may include an implementation of a networking environment. Program modules 142 generally carry out the functions and/or methodologies of the various embodiments. For example, a program module may be software for building a fast lithography model.

Computer system/server 112 may also communicate with one or more external devices 114 such as a keyboard, a pointing device, a display 124, etc.; one or more devices that enable a user to interact with computer system/server 112; and/or any devices (e.g., network card, modem, etc.) that enable computer system/server 112 to communicate with one or more other computing devices. Such communication can occur via I/O interfaces 122 through wired connections or wireless connections. Still yet, computer system/server 112 can communicate with one or more networks such as a local area network (LAN), a general wide area network (WAN), and/or a public network (e.g., the Internet) via network adapter 120. As depicted, network adapter 120 communicates with the other components of computer system/server 112 via bus 118. It should be understood that although not shown, other hardware and/or software components could be used in conjunction with computer system/server 112. Examples, include, but are not limited to: microcode, device drivers, tape drives, RAID systems, redundant processing units, data archival storage systems, external disk drive arrays, etc.

Figure 2:
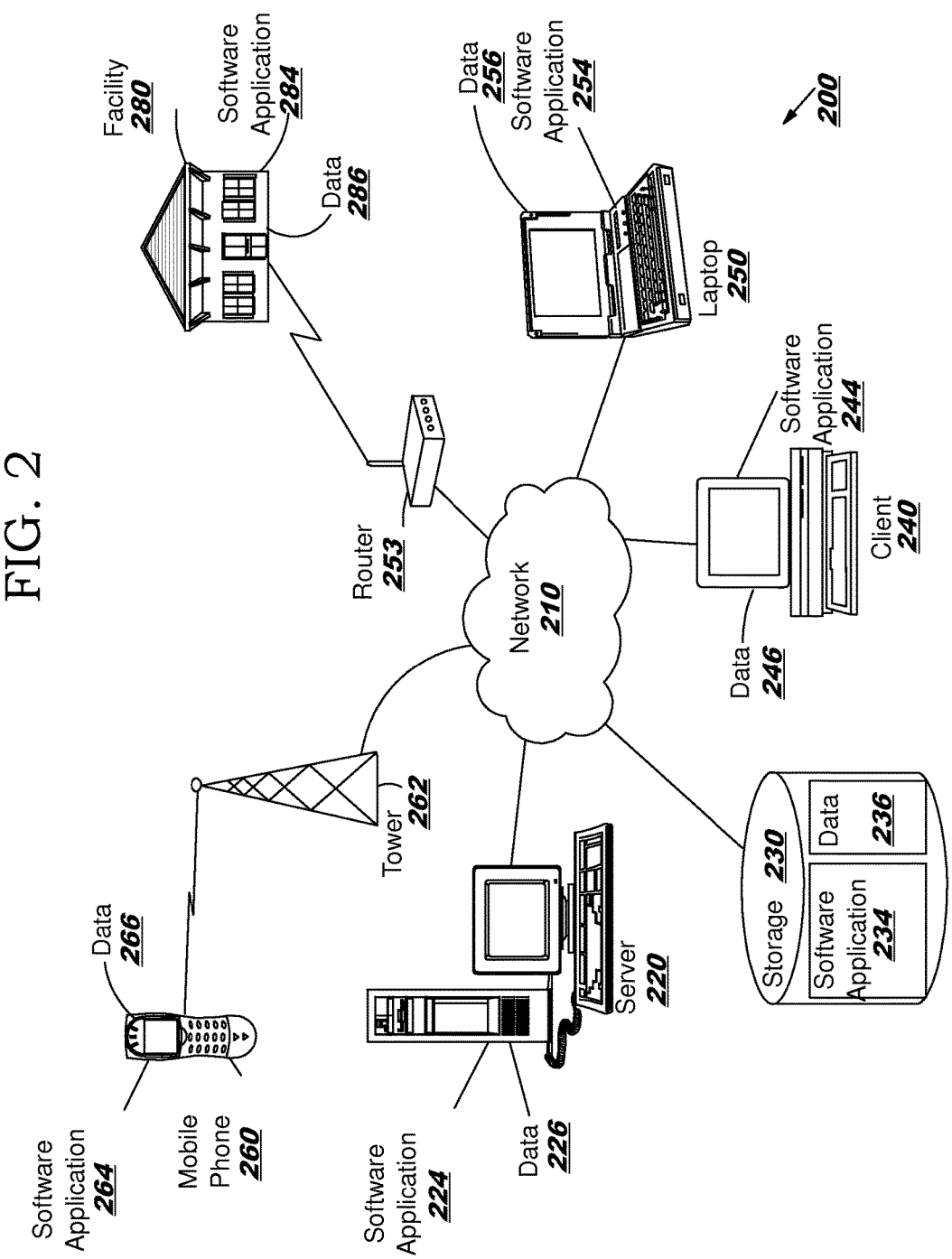
FIG. 2 is a block diagram of a network of data processing systems in which various embodiments may be implemented.

FIG. 2 is a block diagram of a network of data processing systems in which various embodiments may be implemented. Data processing environment 200 is a network of data processing systems such as described above with reference to FIG. 1. Software applications may execute on any computer or other type of data processing system in data processing environment 200. Data processing environment 200 includes network 210. Network 210 is the medium used to provide simplex, half duplex and/or full duplex communications links between various devices and computers connected together within data processing environment 200. Network 210 may include connections such as wire, wireless communication links, or fiber optic cables.

Server 220 and client 240 are coupled to network 210 along with storage unit 230. In addition, laptop 250 and facility 280 (such as a home or business) are coupled to network 210 including wirelessly such as through a network router 253. A mobile phone 260 may be coupled to network 210 through a mobile phone tower 262. Data processing systems, such as server 220, client 240, laptop 250, mobile phone 260 and facility 280 contain data and have software applications including software tools executing thereon. Other types of data processing systems such as personal digital assistants (PDAs), smartphones, tablets and netbooks may be coupled to network 210.

Server 220 may include software application 224 and data 226 for building a fast lithography or other software applications and data in accordance with embodiments described herein. Storage 230 may contain software application 234 and a content source such as data 236 for building a fast lithography model. Other software and content may be stored on storage 230 for sharing among various computer or other data processing devices. Client 240 may include software application 244 and data 246. Laptop 250 and mobile phone 260 may also include software applications 254 and 264 and data 256 and 266. Facility 280 may include software applications 284 and data 286. Other types of data processing systems coupled to network 210 may also include software applications. Software applications could include a web browser, email, or other software application that can build a fast lithography model.

Server 220, storage unit 230, client 240, laptop 250, mobile phone 260, and facility 280 and other data processing devices may couple to network 210 using wired connections, wireless communication protocols, or other suitable data connectivity. Client 240 may be, for example, a personal computer or a network computer.

In the depicted example, server 220 may provide data, such as boot files, operating system images, and applications to client 240 and laptop 250. Server 220 may be a single computer system or a set of multiple computer systems working together to provide services in a client server environment. Client 240 and laptop 250 may be clients to server 220 in this example. Client 240, laptop 250, mobile phone 260 and facility 280 or some combination thereof, may include their own data, boot files, operating system images, and applications. Data processing environment 200 may include additional servers, clients, and other devices that are not shown.

In the depicted example, data processing environment 200 may be the Internet. Network 210 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 200 also may be implemented as a number of different types of networks, such as for example, an intranet, a local area network (LAN), or a wide area network (WAN). FIG. 2 is intended as an example, and not as an architectural limitation for the different illustrative embodiments.

Among other uses, data processing environment 200 may be used for implementing a client server environment in which the embodiments may be implemented. A client server environment enables software applications and data to be distributed across a network such that an application functions by using the interactivity between a client data processing system and a server data processing system. Data processing environment 200 may also employ a service oriented architecture where interoperable software components distributed across a network may be packaged together as coherent business applications.

Figure 3:
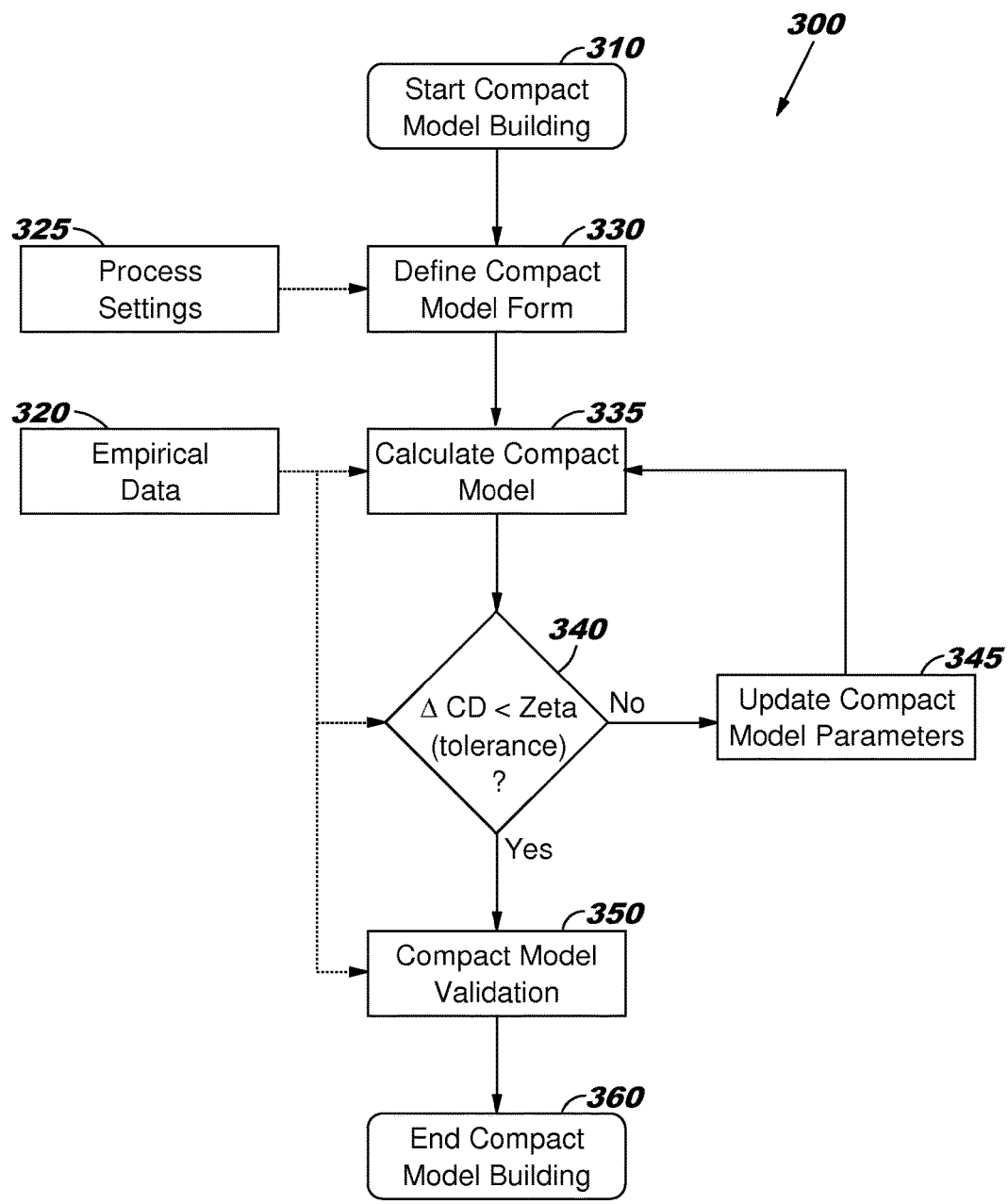
FIG. 3 is a flow diagram of a prior art empirical data only based model building process.

FIG. 3 is a flow diagram of a prior art empirical data only based model building process. The current method of fitting a compact model is based on using empirical data gathered from a semiconductor manufacturing process to construct the model. These measurement points typically range in the hundreds to thousands of points. At least one set of data points needs to be gathered for each process condition, although replicate points are preferred to insure the quality of the measured data. Each data point must be exposed on prepared silicon, post processed, and measured on a CD SEM. This can amount to between 1 and 5 minutes of manufacturing time for each data point, which is expensive in a wafer fabrication environment.

In the current compact model flow 300, which starts at compact building model at 310, there are two inputs, the process settings 325 and empirical data 320. In addition the user must define a model form for the compact model in step 330. This form can be as simple as an optical model or more complex to include photoresist, three-dimensional mask features, and/or wafer etch in the model, amongst other effects. The process settings and empirical data are used to fit the model to a point where the model has an acceptable tolerance to the measured data.

The fit process consists of calculating the compact model with the current process parameters in step 335. The model is then measured against the empirical data set in step 340. If the modeled CDs are greater than a tolerance $\zeta$ (zeta), the model parameters are updated to new values in step 345 and the model is calculated again in step 335 then compared in step 340. The calculation and comparison may be done with a search technique such as a full factorial search and a cost function.

Once the modeled CDs are less than the tolerance $\zeta$ (zeta), the fit is complete. The final model is then validated by the model builder in step 350, after which the compact model building ends at 360. This validation normally takes place on a larger or different data set than the empirical data set used for compact model fitting.

Various embodiments are now described with reference to the figures. These embodiments relate to reducing empirical data collection time in a wafer fab through the use of virtual first principle data to build a virtual compact OPC model for the purpose of manufacturing OPC corrected semiconductor designs. In one approach, the virtual model is generated for the purpose of building an OPC runset. In another approach, the virtual model process is used to remove bad virtual data points from the empirical data set. In another embodiment, the rigorous model is used to generate data for off process conditions. In an additional embodiment, the rigorous model is used to generate process information for through resist thickness evaluation. In another embodiment, the rigorous data can be extrapolated beyond the empirical data set for compact model validation.

Figure 4:
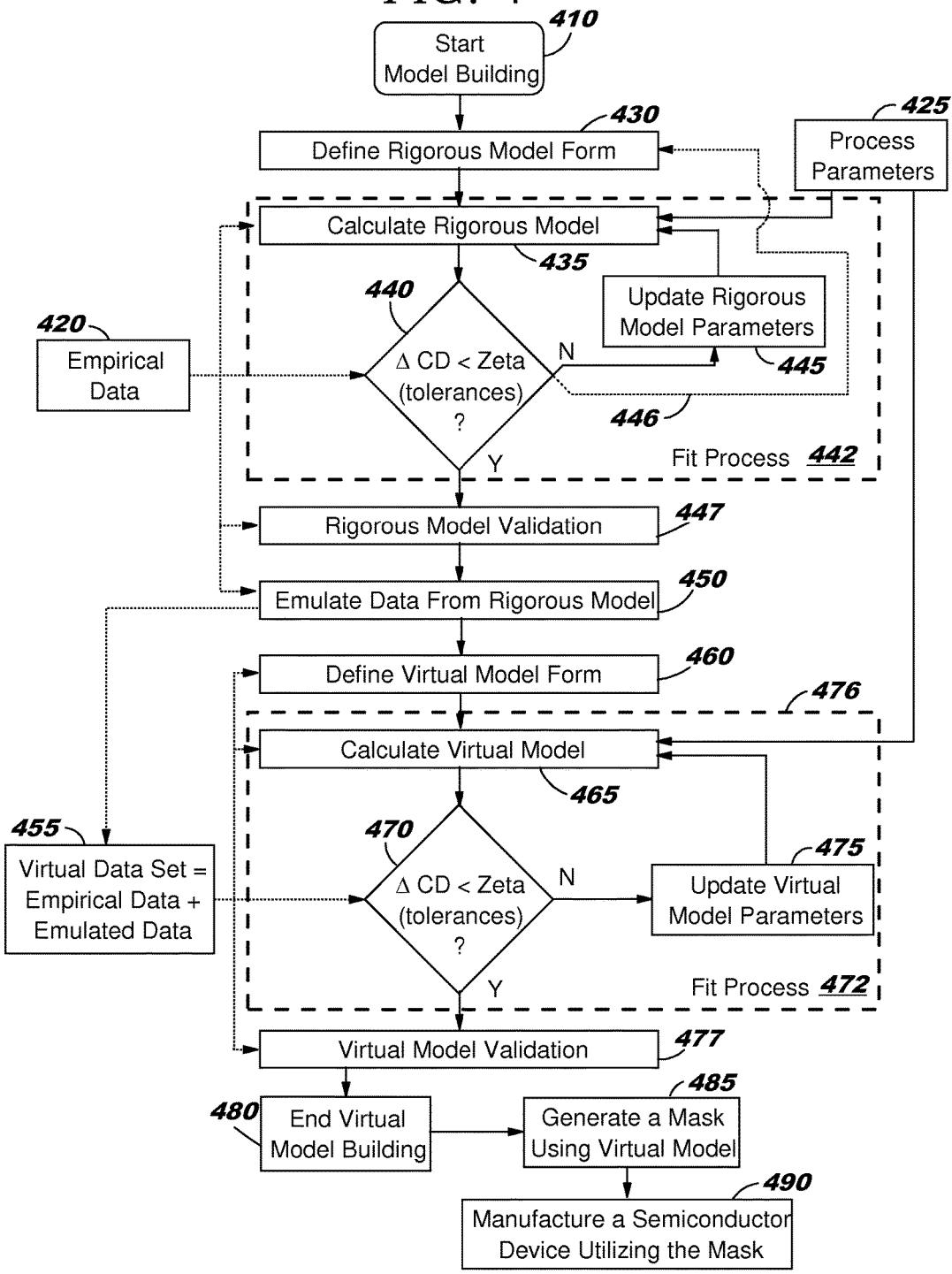
FIG. 4 is a flow diagram of a virtual model building process in accordance with a first embodiment.

FIG. 4 is a flow diagram 400 of a virtual model building process in accordance with a first embodiment. This embodiment involves the creation of a first principles based rigorous model and then using that model to generate data for building a virtual compact model. A rigorous model is a model that predicts process behavior from first principles and limited empirical data, usually 20 to 50 points. A rigorous model is normally a complete model that predicts process changes due to process parameter changes such as but not limited to defocus, dose variation, or photoresist thickness. A rigorous model is also capable of predicting process changes due to variation in the Z direction. In this embodiment, the first series of steps is to construct a rigorous model. In this process there are two user inputs, process parameters (i.e. settings) 425 defining a process condition and empirical data 420 derived under the process condition. These inputs are used in the construction of a rigorous model in steps 430 through 447 as follows.

The user must define a model form for the rigorous model from first principles in step 430. This form can be as simple as an optical model or more complex to include photoresist, three-dimensional mask features, and/or wafer etch in the model, amongst other first principles based effects. The process settings and empirical data are then used in steps 435 through 445 as described below to fit the model to a point where the model has an acceptable tolerance to the measured empirical data 420.

The fit process 442 starts with calculating the rigorous model with the current process parameters 425 and empirical data 420 in step 435. Then in step 440, the rigorous model CD (critical dimension) results are measured against empirical data 420. If it is determined that the differences (ΔCD) are greater than a tolerance $\zeta$(zeta), then the model process parameters are updated to new values in step 445 and the model is calculated again in step 435 then compared again in step 440. The calculation and comparison may be done with a search technique such as a full factorial search and a cost function. As shown by a dotted line 446, if an acceptable model is not created within the desired tolerances after several iterations of steps 435 through 445 (i.e. no fit is created), then processing may return to step 430 to adjust the first principles based model form.

Once the modeled CD differences are less than the tolerance $\zeta$ (zeta), the fit is complete. The final model is then validated by the model builder in step 447. This validation normally takes place on a larger or different empirical data set than the empirical data set used for rigorous model fitting. If the validation is not successful, then processing may return to steps 435 or 430.

In step 450, emulated data from the rigorous model is generated for use in building the virtual model form in step 460. This data generation may take just a few minutes for thousands of points. Once this virtual data set is generated, it may or may not be mixed with some or all of the empirical data. This new virtual data set from step 455 is then used to construct the virtual model in steps 460 through 480 as follows. This approach of using emulated data to generate a compact model is counterintuitive to industry practices. As described with reference to FIG. 3, empirical data is generally used on generating a compact model. However, as shown with reference to FIG. 5 below, the use of emulated data in generating a virtual compact model in accordance with the various embodiments has shown to be advantageous.

A virtual model form for the virtual model is generated from the virtual data set in step 430. The process settings and virtual data set are then used in steps 465 through 475 as described below to fit the model to a point where the model has an acceptable tolerance to the virtual data set 455.

The fit process 472 starts with calculating the virtual model with the current process parameters 425 and virtual data set 455 in step 465. Then in step 740, the virtual model CD (critical dimension) results are measured against virtual data set 455. If it is determined that the differences ($\Delta$CD) are greater than a tolerance $\zeta$ (zeta), then the model process parameters are updated to new values in step 475 and the model is calculated again in step 465 then compared again in step 470. The calculation and comparison may be done with a search technique such as a full factorial search and a cost function.

Once the modeled CD differences are less than the tolerance $\zeta$ (zeta), the fit is complete. The final virtual model is then validated by the model builder in step 477. This validation normally takes place on a larger or different virtual data set than the virtual data set used for virtual model fitting. If the validation is not successful, then processing may return to steps 465. The process of model building is then completed in step 480. Subsequently, in step 485, the virtual model may be utilized to generate (design and/or manufacture) a mask or set of masks for use in manufacturing. After the mask(s) are generated, they are then used to manufacture semiconductor devices in step 490.

FIG. 5 is a table illustrating the efficacy of the first embodiment. FIG. 5 highlights models A, B, and C. Model A is a standard compact model, Model B is a standard compact model constructed from a reduced data set of Model A, and Model C is a virtual model as described in the first embodiment. Model C produces the best results due to data that are verified by a second embodiment and the increased data density from the virtual data. The use of emulated data to generate a compact model is counterintuitive to standard industry practices, but is advantageous in accordance with the various embodiments has shown to be advantageous.

Figure 6:
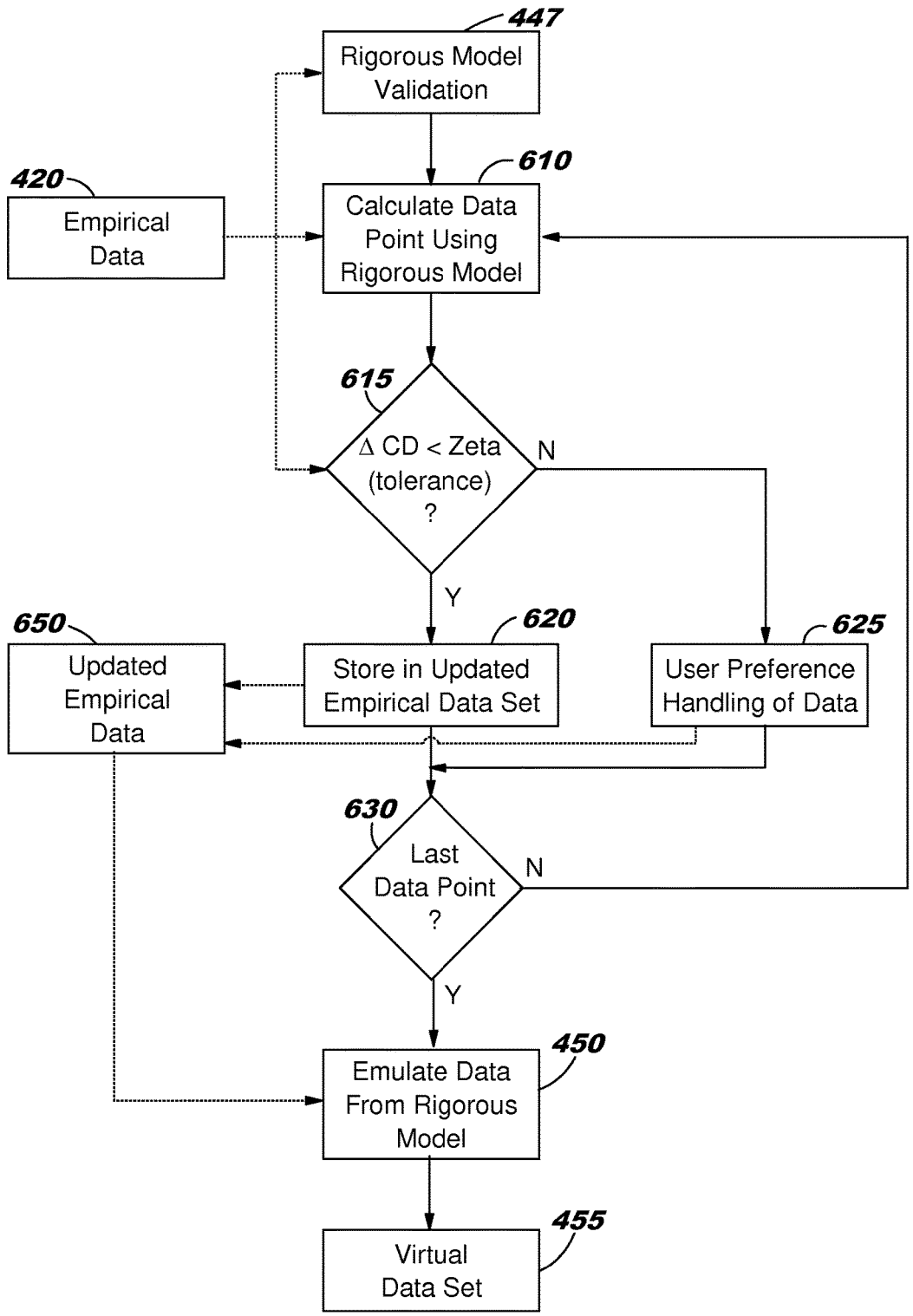
FIG. 6 is a flow diagram of a process for verifying the quality of the empirical data in accordance with a second embodiment.

FIG. 6 is a flow diagram of a process for verifying the quality of the empirical data in accordance with a second embodiment. This second embodiment uses the rigorous model illustrated in FIG. 4 to verify the quality of the empirical data. Empirical data are noisy, with measurement errors on the order of +/−2 nm for a 30 nm structure. Other errors such as mask manufacturing errors can lead to dramatically different empirical values than are expected in a perfect situation. For example purposes, a designed mask aperture may be 42 nm wide, which should produce a 30 nm CD on the wafer. However, due to variations in mask manufacturing, the aperture may actually be 44 nm wide, leading to a 37 nm CD on the wafer. Empirical data gathering does not normally collect data on mask sizes, so this error would be random, and may not even be noticed. However, it can make a compact process model reduce accuracy.

A process is added to the flow between steps 447 and 450 of FIG. 4 that uses the rigorous model to verify the quality of the empirical data. In a first step 610 a data point is calculated with the rigorous model under the same conditions and location as an empirical point. In step 615, the two points are compared ($\Delta$CD), and if they are found to be within tolerance $\zeta$ (zeta), then in step 620 the point is stored in an updated empirical data set 650. Alternatively, in step 620, the data point may be kept in empirical data set 420. If the point is found to be outside of tolerance in step 615, then in step 625 the empirical point is either eliminated from the fit, replaced by a virtual point, or deweighted in the fit process to updated empirical data set 650 according to user preferences. Processing then proceeds from steps 620 and 625 to step 630 where it is determined whether the last empirical data point has been verified. If not, then processing returns to step 610. Otherwise, processing continues to step 450 (i.e. from FIG. 4) where the rigorous model is used to emulate data from the updated empirical data set 650 to generate the virtual data set 455.

Figure 7:
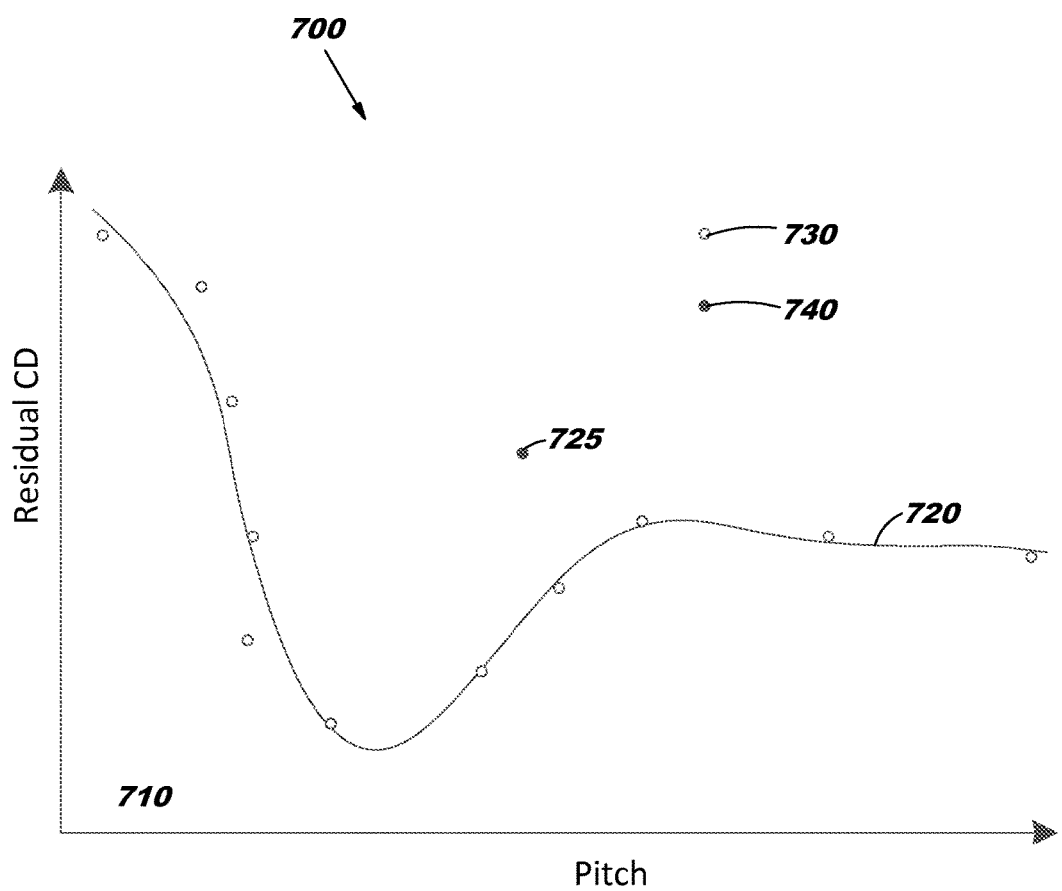
FIG. 7 is a data chart illustrating the use of the second embodiment to verify empirical data.

FIG. 7 is a data chart 700 illustrating the use of the second embodiment to verify empirical data. This chart illustrates an empirical data set and how it can be observed to have bad points. The plot axes (710) are pitch vs. residual CD. Line 720 is a plot of the modeled CD residual (modeled CD - drawn CD). Points 730 and 740 identify the empirical CD residual (measured empirical CD - drawn CD). Point 725 is a point 740 with obvious measurement errors as compared to the modeled values while points 730 are within tolerance of the modeled values. As a result, point 725 may be eliminated from the set of empirical data due to it being an apparent outlier.

Figure 8:
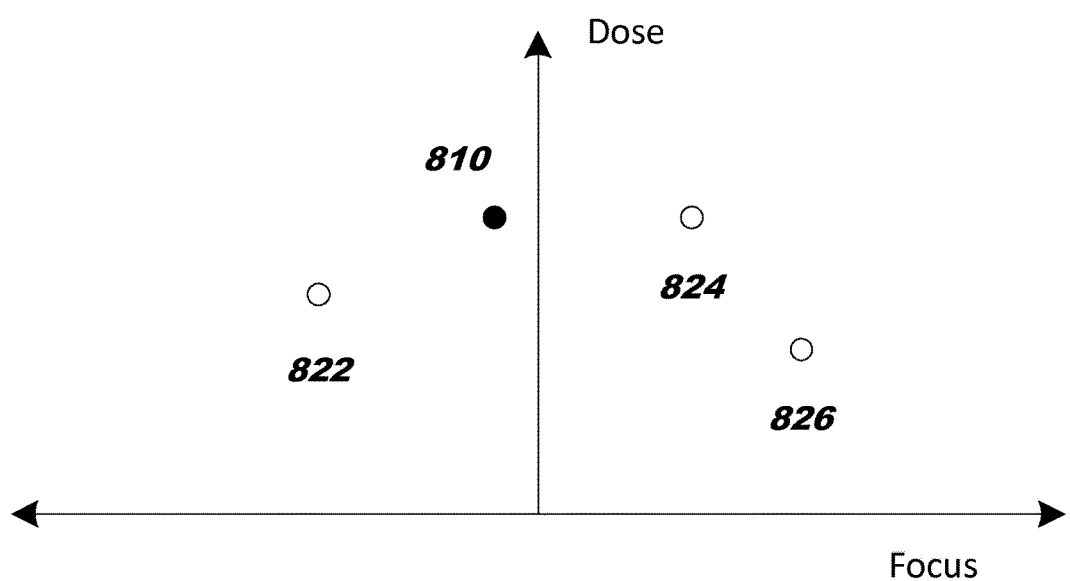
FIG. 8 is a data chart illustrating the use of a third embodiment to implement multiple virtual models for various process conditions.

A third embodiment deals with process window empirical data for making process window compact virtual models. Traditionally, each compact model currently must have a constant set of process parameters and models only that process point. However, it is useful when performing OPC corrections to have models that produce reliable information about several process points. Process conditions can be anything that is controlled in the manufacturing process such as photoresist thickness, bake temperature, air temperature, humidity, dose, focus, and many other parameters. The most common process points are dose and focus. FIG. 8 is a data chart illustrating the use of the third embodiment to implement multiple virtual models for various process conditions. FIG. 8 illustrates a dose and focus process at a CD measurement for a given feature. Point 810 is considered the on target or best process location for a process, while points 822 through 826 are off process conditions with different dose and focus values. A compact virtual model can be produced for each of these locations.

In this third embodiment, the rigorous model can be used to completely produce an emulated off process data set for each point 822, 824, and 826. These data sets are then put through the virtual compact model fitting process and produce 3 separate process models for use during the OPC development process. This dramatically reduces the time invested in collecting empirical process data. In addition, empirical data becomes more difficult to measure as the process moves further away from the target process because CD edges become blurred. This embodiment removes that noise allowing for much better process model fits.

In a fourth embodiment, the CD value as a function of the photoresist height can be used to build a model. CD as a function of photoresist height cannot be measured from a CD SEM. It must be measured in a cross sectional SEM, and the process of measurement destroys the wafer. Different problems can occur at different photoresist heights that are not obvious from the CD SEM. These can include very thin photoresist that will be etched through, or excess photoresist that can partially or fully block the etch process.

Figure 9:
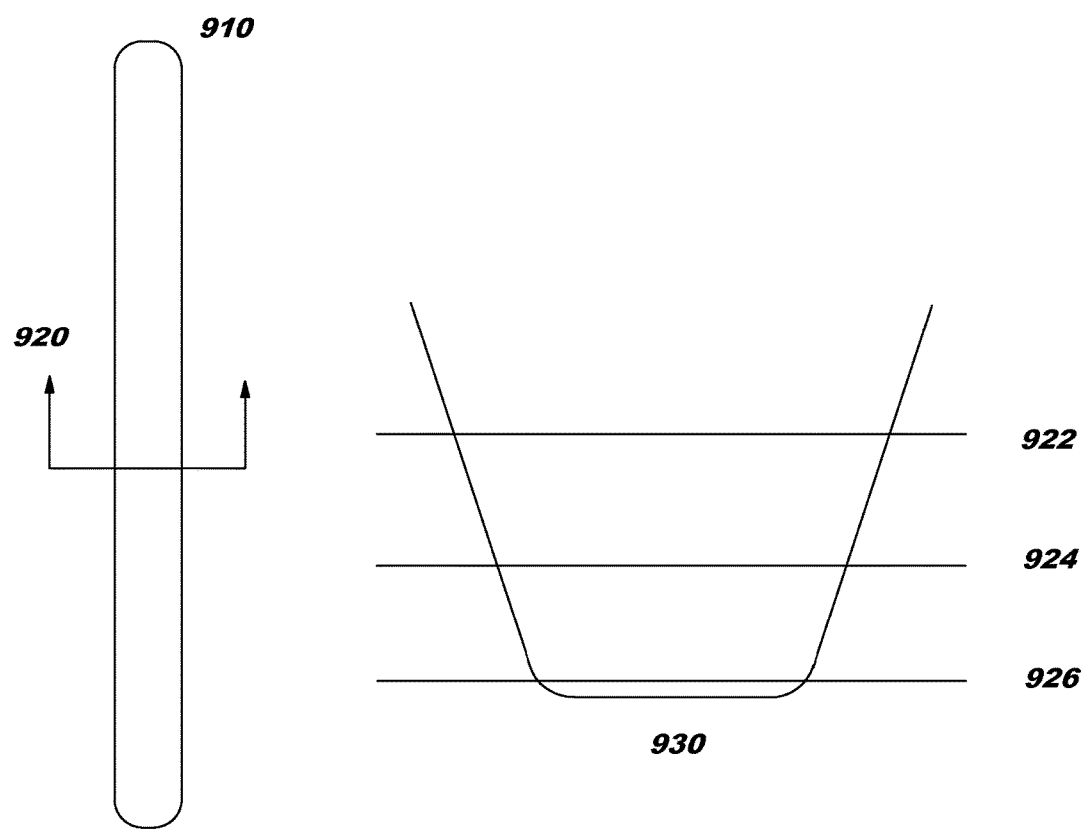
FIG. 9 is a data chart illustrating the use of a fourth embodiment to implement a resist height model.

FIG. 9 is a data chart illustrating the use of the fourth embodiment to implement a resist height model. FIG. 9 depicts the desired information to be gained from a thickness model. Line 910 is a trench in photoresist. 920 is the cross section point that produces the profile 930. Lines 922, 924, and 926 are CD measurements at various heights in the trench.

The rigorous model can be used to generate a set of emulated CD data for each height. This emulated data can then be used in the virtual compact model process to create a resist height model for each line 922, 924, and 926.

A fifth embodiment can be used for virtual compact model validation. Once the rigorous model has been produced, it can be used to produce an extensive validation emulated test data set for a virtual or regular compact model. This validation set can be 10,000 or more data points, and is produced rapidly without incurring the process cost of using the fab. In addition, the validation set can expand well beyond the features used to make the compact virtual model, resulting in an analysis of how well the model predicts various features. The validation generation and analysis processes are rapid, reducing cost and confirming final model accuracy.

The invention can take the form of an entirely software embodiment, or an embodiment containing both hardware and software elements. In a preferred embodiment, the invention is implemented in software or program code, which includes but is not limited to firmware, resident software, and microcode.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM), or Flash memory, an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code such as for building a fast lithography model. A client data processing system may download that computer usable code, such as for storing on a data storage medium associated with the client data processing system, or for using in the client data processing system. The server data processing system may similarly upload computer usable code from the client data processing system such as a content source. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of building a fast lithography Optical Proximity Correction (OPC) model that predicts semiconductor manufacturing process outputs on silicon wafers comprising:
    providing a first principles model of the semiconductor manufacturing process;
    providing a set of empirical data for storage in memory;
    utilizing a processor to develop a rigorous model from the first principles model and the set of empirical data;
    utilizing the processor running the rigorous model to generate emulated data; and
    using the emulated data to develop a virtual model to predict the semiconductor manufacturing process outputs.

2. The method of claim 1 wherein the rigorous model is developed for a process condition and wherein the emulated data is generated for the process condition.

3. The method of claim 2 wherein the process condition comprises information about photoresist, mask features and wafer etch.

4. The method of claim 1 wherein the emulated data is generated for multiple process conditions and wherein multiple virtual models are developed for the multiple process conditions, thereby predicting semiconductor process outputs for the multiple process conditions.

5. The method of claim 1 wherein the emulated data is combined with a second set of empirical data for a process condition to develop the virtual model.

6. The method of claim 5 wherein the processor utilizes the rigorous model to validate the second set of empirical data.

7. The method of claim 6 wherein the first set of empirical data and the second set of empirical data have common data.

8. The method of claim 1 wherein the processor running the rigorous model is utilized to generate emulated off process data sets for multiple process points to develop multiple off process virtual compact models.

9. The method of claim 1 wherein the virtual model is utilized to generate a set of masks.

10. The method of claim 9 wherein the set of masks are utilized to manufacturing a semiconductor device.

11. A data processing system for building a fast lithography Optical Proximity Correction (OPC) model that predicts semiconductor manufacturing process outputs on silicon wafers, the data processing system comprising:
    a processor; and
    a memory storing program instructions which when executed by the processor execute the steps of:
    providing a first principles model of the semiconductor manufacturing process;
    providing a set of empirical data for storage in memory;
    utilizing the processor to develop a rigorous model from the first principles model and the set of empirical data;
    utilizing the processor running the rigorous model to generate emulated data; and
    using the emulated data to develop a virtual model to predict the semiconductor manufacturing process outputs.

12. The data processing system of claim 11 wherein the rigorous model is developed for a process condition and wherein the emulated data is generated for the process condition.

13. The data processing system of claim 11 wherein the emulated data is generated for multiple process conditions and wherein multiple virtual models are developed for the multiple process conditions, thereby predicting semiconductor process outputs for the multiple process conditions.

14. The data processing system of claim 11 wherein the emulated data is combined with a second set of empirical data for a process condition to develop the virtual model.

15. The data processing system of claim 14 wherein the processor utilizes the rigorous model to validate the second set of empirical data.

16. The data processing system of claim 15 wherein the first set of empirical data and the second set of empirical data have common data.

17. The data processing system of claim 11 wherein the virtual model is utilized to generate a set of masks.

18. The data processing system of claim 17 wherein the set of masks are utilized to manufacturing a semiconductor device.

19. The data processing system of claim 17 the process condition comprises information about photoresist, mask features and wafer etch.

* * * * *